(12) United States Patent
Webster

(10) Patent No.: US 9,312,401 B2
(45) Date of Patent: Apr. 12, 2016

(54) SINGLE PHOTON AVALANCHE DIODE IMAGING SENSOR FOR COMPLEMENTARY METAL OXIDE SEMICONDUCTOR STACKED CHIP APPLICATIONS

(71) Applicant: OMNIVISION TECHNOLOGIES, INC., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 311 days.

(21) Appl. No.: 14/155,848

(22) Filed: Jan. 15, 2014

(65) Prior Publication Data
US 2015/0200222 A1    Jul. 16, 2015

(51) Int. Cl.
| | |
|---|---|
| *H01L 27/00* | (2006.01) |
| *H03K 17/78* | (2006.01) |
| *H01J 40/14* | (2006.01) |
| *H01L 31/02* | (2006.01) |
| *H01L 31/107* | (2006.01) |
| *H01L 27/146* | (2006.01) |

(52) U.S. Cl.
CPC .... *H01L 31/02027* (2013.01); *H01L 27/14609* (2013.01); *H01L 27/14634* (2013.01); *H01L 27/14636* (2013.01); *H01L 31/107* (2013.01); *H01L 27/1463* (2013.01)

(58) Field of Classification Search
USPC ......... 250/208.1, 216, 214 R, 214.1, 214 DC; 348/272–283, 294–324, 332, 333.08, 348/335–338; 257/233, 291–294, 414, 257/431–466
See application file for complete search history.

(56) References Cited

U.S. PATENT DOCUMENTS

| 2013/0082286 A1* | 4/2013 | Finkelstein | ......... H01L 31/0336 257/84 |
| 2013/0099091 A1* | 4/2013 | Nemirovsky | ......... H01L 31/107 250/206 |
| 2013/0193546 A1* | 8/2013 | Webster | .............. H01L 27/1443 257/438 |

OTHER PUBLICATIONS

Minoglou et al., "Reduction of Electrical Crosstalk in Hybrid Backside Illuminated CMOS Imagers Using Deep Trench Isolation," IEEE, 2008, pp. 129-131.
De Munck et al., "Backside Illuminated Hybrid FPA Achieving Low Cross-Talk Combined With High QE," International Image Sensor Society, 2011 (3 pages).

* cited by examiner

*Primary Examiner* — Pascal M Bui Pho
(74) *Attorney, Agent, or Firm* — Blakely Sokoloff Taylor & Zafman LLP

(57) ABSTRACT

An imaging sensor system includes a single photon avalanche diode (SPAD) imaging array including N pixels formed in a first semiconductor layer of a first wafer. Substantially an entire thickness of the first semiconductor layer of each pixel is fully depleted such that a multiplication region included in each pixel near a front side is configured to be illuminated with photons through a back side and through the substantially entire thickness of the fully depleted first semiconductor layer. Deep n type isolation regions are disposed in the first semiconductor layer between the pixels to isolate the pixels. N digital counters are formed in a second semiconductor layer of a second wafer that is bonded to the first wafer. Each of the N digital counters is coupled to the SPAD imaging array and coupled to count output pulses generated by a respective one of the pixels.

18 Claims, 5 Drawing Sheets

SINGLE PHOTON AVALANCHE DIODE IMAGING SENSOR FOR COMPLEMENTARY METAL OXIDE SEMICONDUCTOR STACKED CHIP APPLICATIONS

BACKGROUND INFORMATION

1. Field of the Disclosure

The present invention relates generally to photodetectors, and more specifically, the present invention is directed to imaging systems including single photon avalanche diode imaging sensors.

2. Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these image sensors.

One type of photodetector that may be used in an image sensor or in a light detector is a single photon avalanche diode (SPAD). A SPAD (also referred to as a Geiger-mode avalanche photodiode (GM-APD)) is a solid-state photodetector capable of detecting a low intensity signal, such as low as a single photon. SPAD imaging sensors are semiconductor photosensitive devices made up of an array of SPAD regions that are fabricated on a silicon substrate. The SPAD regions produce an output pulse when struck by a photon. The SPAD regions have a p-n junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The intensity of the photon signal received by the image sensor is obtained by counting the number of these output pulses within a window of time.

However, it is difficult to optimize a SPAD for excellent detection efficiency, spectral response, and timing resolution when the SPAD is fabricated with a standard complementary metal oxide semiconductor (CMOS) process. For instance, operating SPADs in full depletion is not generally possible in standard CMOS processes because operating SPADs in full depletion may cause the metal oxide semiconductor field effect transistors (MOSFETs) not to function correctly. In addition, having SPADs arranged in the same plane as the MOSFETs of the CMOS circuitry reduces the fill factor. Furthermore, it is also difficult to achieve relatively small pitch photon timing sensors with high fill factor and excellent SPAD performance in any single CMOS process.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
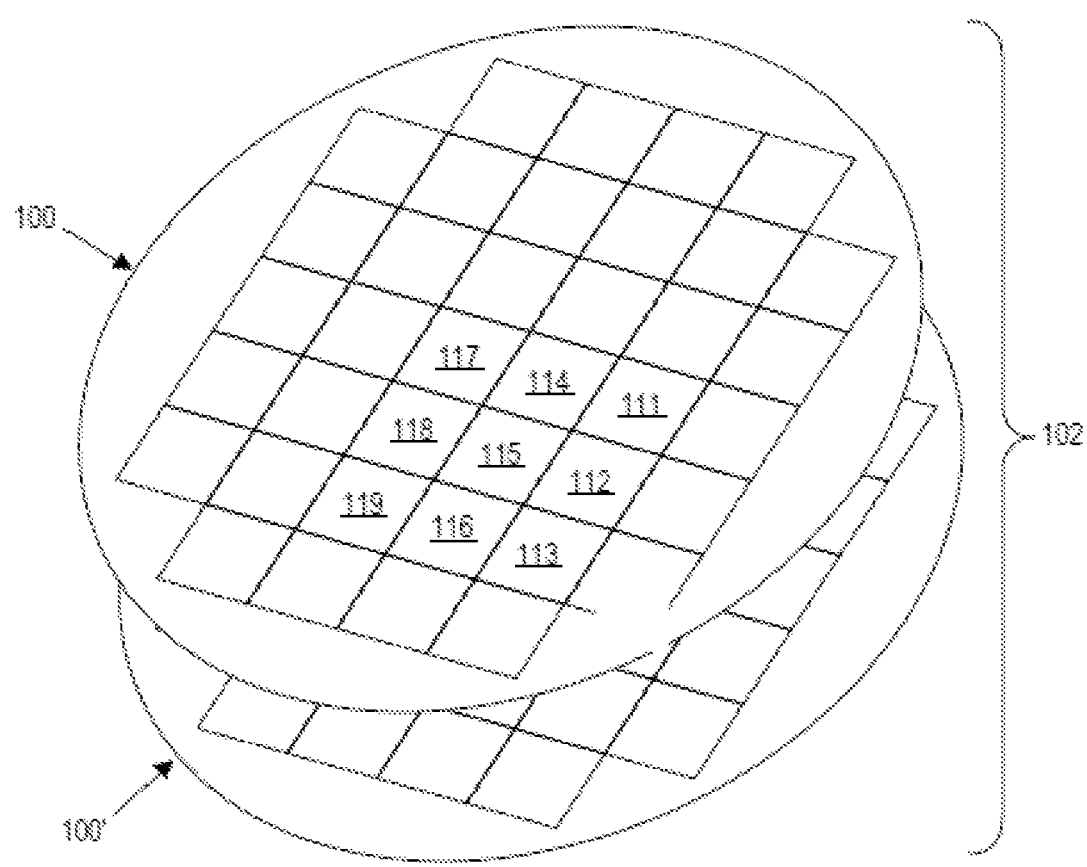
FIG. 1 is an exploded view of one example of stacked semiconductor wafers with integrated circuit dies of a single photon avalanche diode (SPAD) imaging sensor system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, an example single photon avalanche diode (SPAD) imaging sensor system in accordance with the teachings of the present invention includes fully depleted SPAD regions that have been optimized in their own manufacturing process in a back side illuminated (BSI) stacked chip configuration with a custom complementary metal oxide semiconductor (CMOS) processor chip that is fabricated using a standard CMOS process. For instance, in various examples, substantially the entire thickness of the semiconductor layer of each pixel is fully depleted such that a multiplication region included in each pixel near a front side of the semiconductor layer is configured to be back side illuminated with photons through substantially the entire thickness of the fully depleted semiconductor layer. This fully depleted SPAD design allows for very high near infrared (NIR) sensitivity with high blue performance as well. The fully depleted SPADs enable very good timing resolution because electrons can drift through substantially the entire thickness of the depleted semiconductor layer in the SPADs rather than diffuse before being detected which reduces the timing jitter. The example fully depleted SPAD designs in accordance with the teachings of the present invention includes deep n type isolation between SPADs, which allow separate direct current (DC) or alternating current (AC) connections to be made to the terminals of each SPAD, which enables circuit flexibility on the device wafer. Thus, in one example, each SPAD pixel is connected to its own CMOS circuit on the stacked CMOS wafer. This combination makes possible a relatively small pitch photon timing sensor with high fill factor and excellent SPAD performance in accordance with the teachings of the present invention.

To illustrate, FIG. 1 is an exploded view of stacked device wafers 100 and 100' that are to be bonded together to form an integrated circuit system 102 in accordance with the teachings of the present invention. Device wafers 100 and 100' may include silicon, gallium arsenide, or other suitable semiconductor materials. In the illustrated example, device wafer 100 includes semiconductor dies 111-119 while device wafer 100' includes corresponding semiconductor dies (view obscured in FIG. 1). As will be discussed in more detail below, in some examples, each die 111-119 of device wafer 100 may include an array of fully depleted SPADs, while each corresponding die of device wafer 100' with CMOS circuitry including for example an array of digital counters and associated read-out electronics that are fabricated using standard CMOS processes. The placement of digital counters on the separate bottom device wafer 100' allows for a very high fill factor in the fully depleted SPAD array on the top device wafer 100. Furthermore, since device wafer 100 is formed separately from device wafer 100', custom fabrication processes may be utilized to optimize the formation of fully depleted SPAD regions in the SPAD array on device wafer 100, while traditional CMOS processes may be retained when forming the CMOS circuitry on the device wafer 100' in accordance with the teachings of the present invention.

Figure 2:
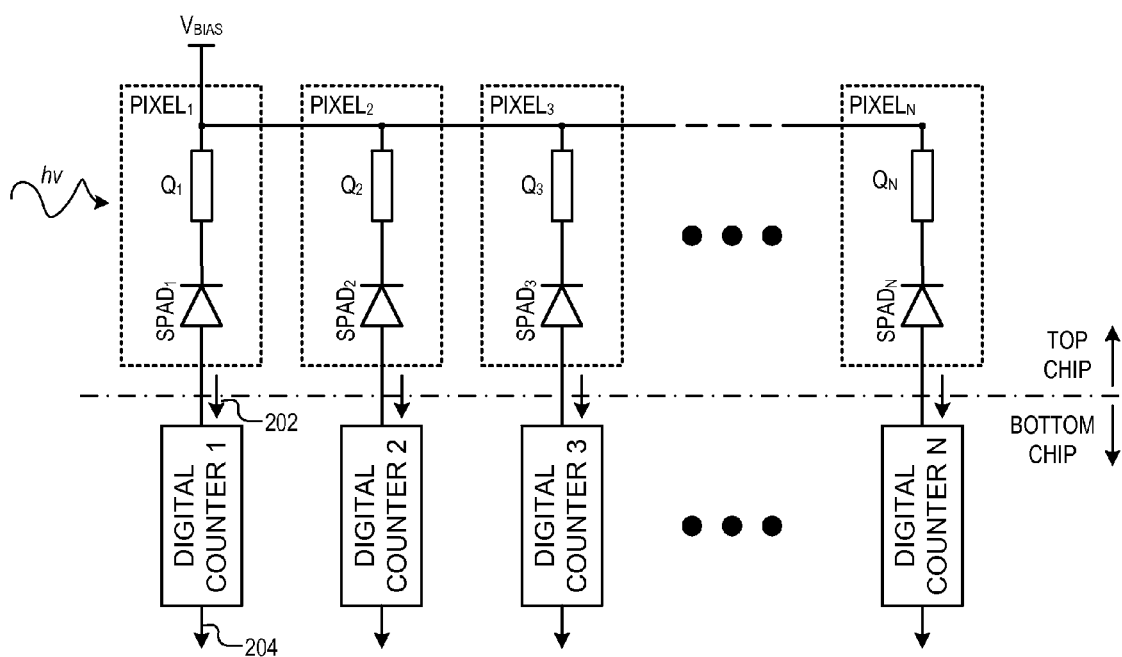
FIG. 2 is a circuit diagram illustrating one example of a stacked chip SPAD imaging sensor system including quenching elements in accordance with the teachings of the present invention.

FIG. 2 is a circuit diagram illustrating one example of a stacked SPAD imaging sensor system including quenching elements in accordance with the teachings of the present invention. It is noted that the pixel circuitry illustrated in FIG. 2 (e.g., $PIXEL_1$, $PIXEL_2$, ... $PIXEL_N$) is one possible example of a SPAD pixel circuitry architecture for implementing each pixel with an imaging array. In the example depicted in FIG. 2, pixels $PIXEL_1$ through $PIXEL_N$ are illustrated as being arranged in a single row. However, in other examples, it is appreciated that pixels of an imaging array may be arranged into a single column, or into a two-dimensional array of columns and rows.

As shown in the example, each example pixel includes a fully depleted SPAD (e.g., $SPAD_1$-$SPAD_N$) coupled to a respective quenching element (e.g., quenching elements $Q_1$-$Q_N$) disposed in a top chip of a stacked chip system. In various examples, it is also noted that the example quenching elements $Q_1$-$Q_N$ that are coupled to each respective $SPAD_1$-$SPAD_N$ may be included in the top chip or the bottom chips in accordance with the teachings of the present invention. It is also appreciated that example quenching elements $Q_1$-$Q_N$ may be implemented using passive or active quenching elements in accordance with the teachings of the present invention.

As shown in the example, there are N number of SPADs, N number of passive quenching elements, and an N number of digital counters (e.g., Digital Counters 1-N). In the depicted example, the digital counters 1-N are implemented using CMOS circuitry disposed on a bottom chip fabricated using a standard CMOS process of the stacked chip system and are electrically coupled to receive output pulses 202 generated by a respective SPAD in response to a received photon. The digital counters 1-N may be enabled to count the number of output pulses 202 generated by each respective SPAD during a window of time and to output a digital signal 204 that is representative of the count. Although the example depicted in FIG. 2 illustrates a direct connection between the pixel circuitry and the digital counter, any connection between pixel circuitry and the digital counter, including by way of AC coupling, may be utilized in accordance with the present teachings. Furthermore, any known SPAD bias polarity and/or orientation may be implemented. In one example, each digital counter includes an amplifier to amplify the received output pulse 202. In one example, other circuitry may be disposed on the bottom chip and coupled to a respective SPAD region via metal traces. Digital or analog circuitry such as timing circuitry may be used for applications in which timing information from detected photons are required such as time of flight.

In operation, each $SPAD_1$-$SPAD_N$ is reverse biased via a bias voltage $V_{BIAS}$ that is above the breakdown voltage of each $SPAD_1$-$SPAD_N$. In response to a single photogenerated carrier, an avalanche multiplication process is triggered that causes an avalanche current at the output of each $SPAD_1$-$SPAD_N$. This avalanche current self-quenches in response to a voltage drop that is developed across the quenching element (e.g., $Q_1$-$Q_N$), which causes the bias voltage across the SPAD to drop. After the quenching of the avalanche current, the voltage across the SPAD recovers to above the bias voltage and then the SPAD is ready to be triggered again. The resulting output pulse 202 of each $SPAD_1$-$SPAD_N$ is received by a respective digital counter 1-N, which increments its count in response thereto.

Conventional SPAD designs that incorporate SPADs on the same chips as the CMOS digital counters fabricated using a standard CMOS process suffer from reduced fill factor on the imaging plane due to the area occupied by the CMOS circuits themselves. In addition, operating conventional SPAD designs in full depletion is not generally possible in standard CMOS processes because it may cause the MOSFETs in the CMOS circuitry not to function correctly. Accordingly, one advantage of implementing a stacked chip structure in accordance with the teachings of the present invention is that SPADs on the top chip are fully depleted, and the CMOS circuitry is a separate bottom chip, which therefore does not reduce the fill factor of the fully depleted SPAD imaging array on the top chip in accordance with the teachings of the present invention.

It is noted that the circuit diagram of FIG. 2 is provided herewith for explanation purposes and that some circuit elements (e.g., passive components such as resistors and capacitors, and active components such as transistors) are not shown in detail so as not to obscure the teachings of the present invention. For example, the illustrated pixel circuitry of FIG. 2 may produce an output pulse that requires amplification prior to being sensed by the input of the digital counters. In another example, the connection at the node between quenching element $Q_1$ and $SPAD_1$ would be at a high voltage, which may require AC coupling.

Figure 3A:
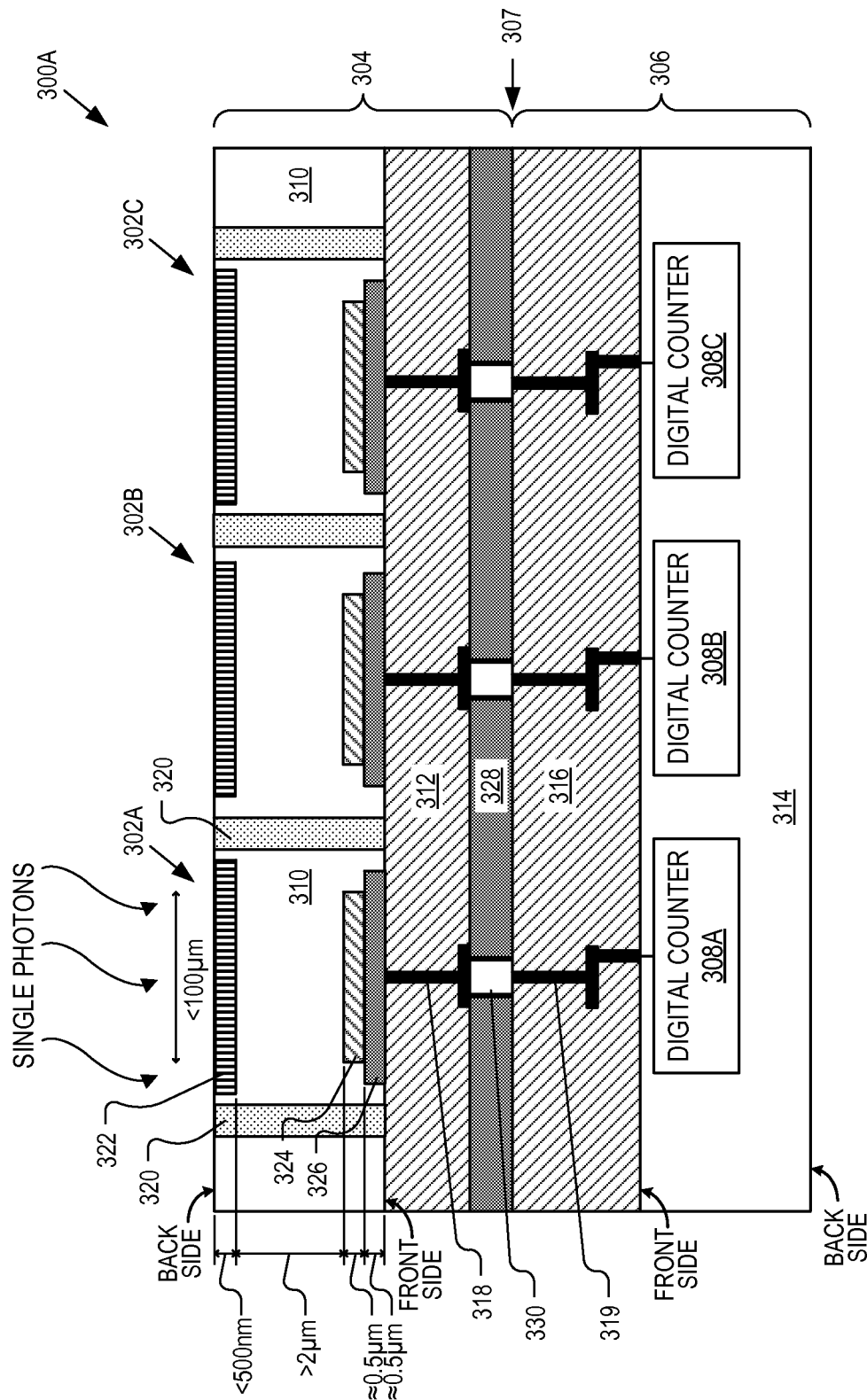
FIG. 3A is a cross-sectional view of one example of an integrated circuit system including a SPAD imaging sensor system with stacked device wafers in accordance with the teachings of the present invention.

FIG. 3A is a cross-sectional view of one example of an integrated circuit system 300A including a SPAD imaging sensor system with stacked device wafers in accordance with the teachings of the present invention. Integrated circuit system 300A is one possible implementation of the portions of the example integrated circuit systems illustrated above in FIGS. 1-2. The illustrated example of integrated circuit system 300A shown in FIG. 3A includes a first device wafer 304, a second device wafer 306, and a bonding interface 307 at which first device wafer 304 is bonded to second device wafer 306. The first device wafer 304 includes a first semiconductor layer 310 and a first interconnect layer 312, while the second device wafer 306 is shown as including a second semiconductor layer 314 and a second interconnect layer 316. In the example, substantially the entire thickness of semiconductor layer 310 is fully depleted and includes a SPAD imaging array including fully depleted SPAD regions 302A, 302B, and 302C as illustrated. In one example, SPAD regions 302A, 302B, and 302C of the SPAD imaging array are arranged into a plurality of rows and columns. In one example, SPAD regions 302A, 302B, and 302C of the SPAD imaging array each include multiplication regions that are formed near a front side of semiconductor layer 310 such that the multiplication regions of SPAD regions 302A, 302B, and 302C are configured to be illuminated through the back side of the semiconductor layer 310 and through the substantially entire thickness of the fully depleted semiconductor layer 310 in accordance with the teachings of the present invention.

In the depicted example, second device wafer 306 is a CMOS logic chip that is fabricated using a standard CMOS process and includes second semiconductor layer 314, which is shown as including digital counters 308A, 308B, and 308C. As shown in the example, digital counters 308A, 308B, and 308C are formed near a front side of the second semiconductor layer 314, and each digital counter 308A, 308B, and 308C is coupled to a respective SPAD region 302A, 302B, and 302C, by way of metal traces 318 and 319, and vias 330. In other words, each SPAD region 302A, 302B, and 302C is coupled to its own respective CMOS circuit (e.g., digital counter 308A, 308B, and 308C) in the depicted example. In one example, other circuitry may be formed in second semiconductor layer 314 and coupled to a respective SPAD region via metal traces. Digital or analog circuitry such as timing circuitry may be used for applications such as time of flight.

In one example, vias 330 are micro-through silicon vias (µTSVs) disposed in an oxide layer 328. In one example, metal traces 318 and 319 may include a stacked series of vias and metal interconnects. In one example, metal traces 318 and 319 may include a redistribution layer (RDL) comprising a thin-film (e.g., aluminum, copper, etc.) for rerouting and redistributing electrical connections between SPAD regions 302A, 302B, and 302C and digital counters 308A, 308B, and 308C. In one example, µTSVs 330 may include a conductive material (e.g., copper, poly-silicon, etc.) deposited therein.

In one example, either or both of semiconductor layer 310 and semiconductor layer 314 may be layers of epitaxially grown silicon. In the depicted example, semiconductor layer 310 is fully depleted such that each SPAD region 302A, 302B, and 302C is fully depleted. In the illustrated example, each SPAD region 302A, 302B, and 302C is substantially similar to one another. For instance, as shown in FIG. 3A, SPAD region 302A includes a p layer 324 and an n+ layer 326 disposed in semiconductor layer 310. A multiplication layer of the SPAD region 302A is defined at the interface between p layer 324 and an n+ layer 326. In one example, SPAD region 302A is also shown as including a p+ layer 322 that is formed at the back side of semiconductor layer 310. In the example, a pn junction of SPAD region 302A is defined at the interface between p layer 324 and an n+ layer 326. In one example, SPAD region 302A is less than approximately 100 µm wide and each of the p and n+ layers 324 and 326 have thicknesses of approximately 0.5 µm. In one example, the p+ layer 322 that is formed at the back side of semiconductor layer 310 has a thickness that is less than approximately 500 nm. Thus, the example fully depleted SPAD imaging array shown in FIG. 3A stacked with a separate CMOS chip provides a relatively small pitch photon timing sensor with high fill factor and excellent SPAD performance in accordance with the teachings of the present invention.

As shown in the depicted example, the multiplication regions between the p and n+ layers of SPAD regions 302A, 302B, and 302C are adapted to be illuminated with photons through the back side of semiconductor layer 310 and through substantially the entire thickness of the fully depleted semiconductor layer 310 in accordance with the teachings of the present invention. In one example, the fully depleted SPAD regions 302A, 302B, and 302C enable very good timing resolution because electrons drift through semiconductor layer 310 of the SPAD regions rather than diffuse before being detected. In one example, the p+ layer 322 on the back side of first semiconductor layer 310 may provide improved blue performance as well. In another example, a charged layer with without the back side p+ layer 322 may also provide improved performance in accordance with the teachings of the present invention.

As shown in the depicted example, deep n type isolation regions 320 are disposed spanning the thickness of first semiconductor layer 310 between SPAD regions 302A, 302B, and 302C to isolate each one of the plurality of pixels of the SPAD imaging array from one another. The isolation provided by the deep n type isolation regions 320 allow separate DC or AC connections to be made to the terminals (e.g., anode and cathode) of each SPAD region 302A, 302B, and 302C, which enable circuit flexibility on the device wafer in accordance with the teachings of the present invention. It is appreciated that the fully depleted SPAD regions 302A, 302B, and 302C allow for very high NIR sensitivity. In another example, the polarity of the doped regions of integrated circuit system 300A may be reversed. For example, deep isolation region 320 and layer 326 are n type and n+ type, respectively, and layers 322 and 324 are n+ type and n type, respectively.

Figure 3B:
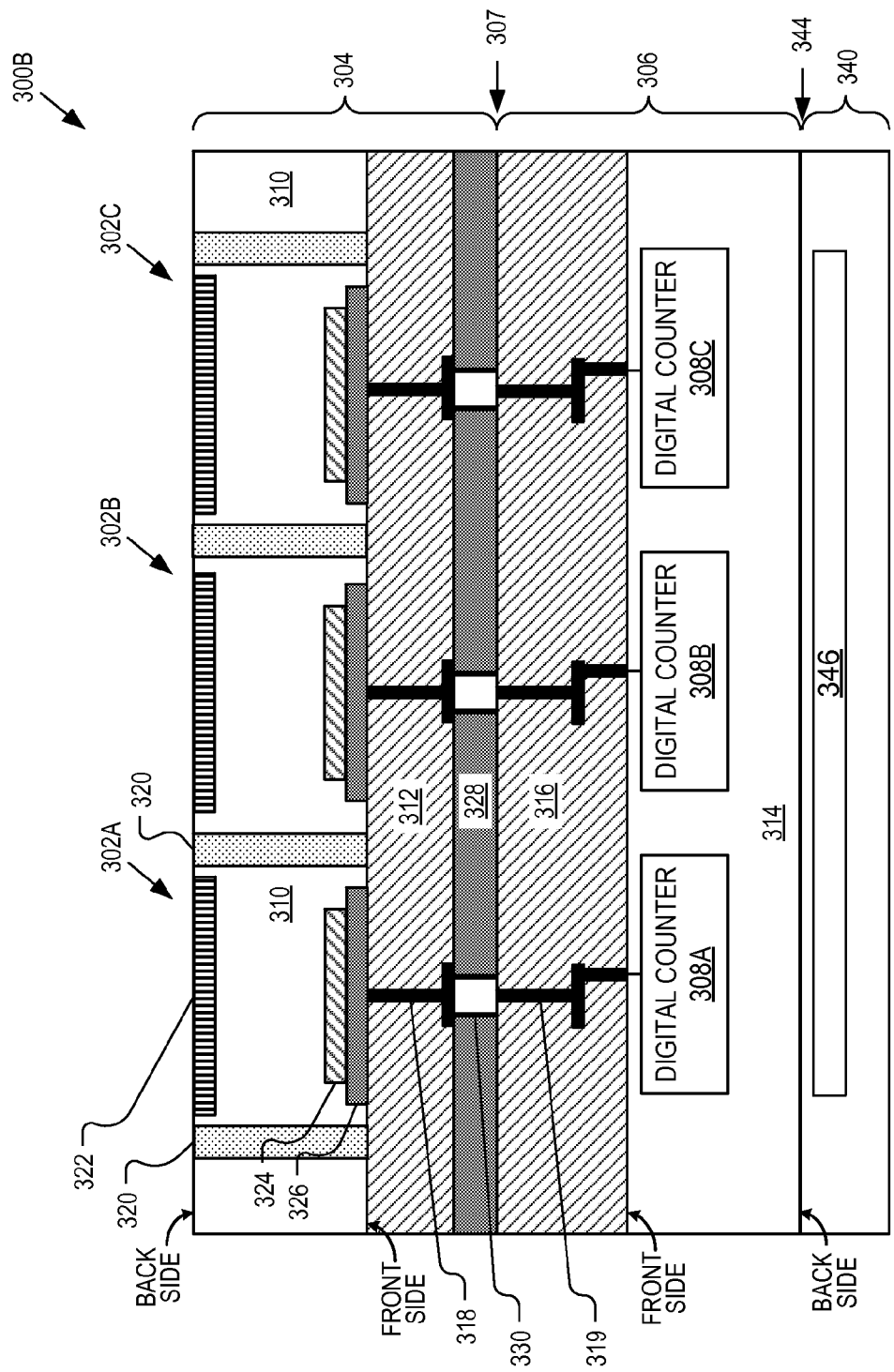
FIG. 3B is a cross-sectional view of one example of an integrated circuit system including a SPAD imaging sensor system with three stacked device wafers in accordance with the teachings of the present invention.

FIG. 3B is a cross-sectional view of an integrated circuit system 300B having stacked device wafers 304, 306, and 340, in accordance with an embodiment of the invention. Integrated circuit system 300B is one possible implementation of a portion of integrated circuit system 102 of FIG. 1. The illustrated example of integrated circuit system 300B includes first device wafer 304, second device wafer 306, third device wafer 340 and bonding interfaces 308 and 344. First device wafer 304 and second device wafer 306 bond and operate as discussed above. However, integrated circuit system 300B includes an additional third wafer 340 bonded to the second device wafer 306. As shown, third wafer 340 includes a third semiconductor layer 342 and semiconductor device 346 formed in or on the third device wafer 340. In one embodiment, device 346 includes a storage device, such as random access memory (RAM), to act as a frame store to enable high-speed burst imaging capability. In this embodiment, device 346 may be coupled to receive and store the outputs of the digital counters included in second semiconductor layer 314.

Figure 4:
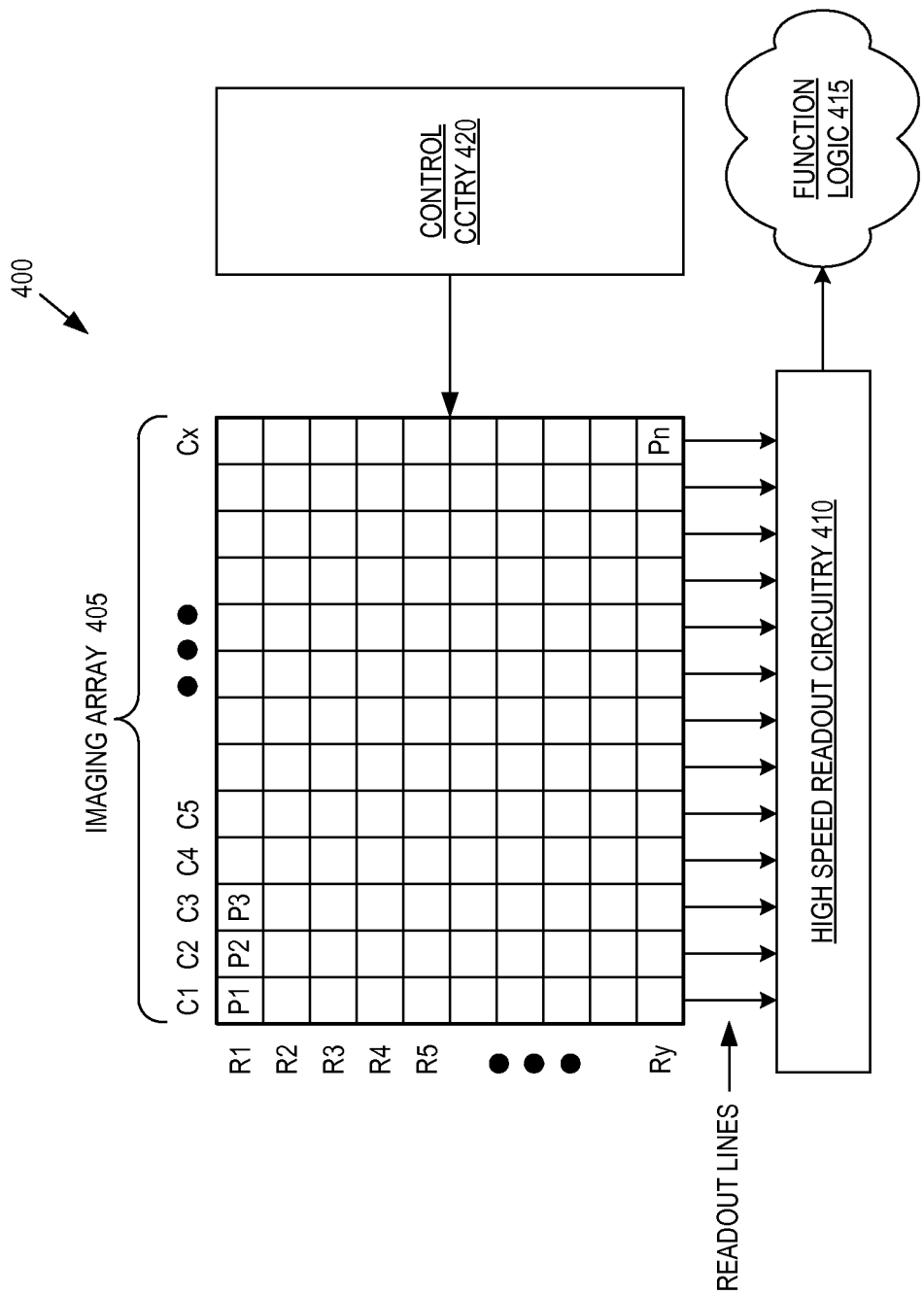
FIG. 4 is a block diagram showing one example of an integrated circuit system having an example SPAD imaging sensor system in accordance with the teachings of the present invention.

FIG. 4 is a block diagram showing one example of an integrated circuit system having an example SPAD imaging sensor system 400 in accordance with the teachings of the present invention. SPAD imaging sensor system 400 may be one example implementation of the portions of the example integrated circuit systems illustrated above in FIGS. 1-3. The illustrated embodiment of SPAD imaging sensor system 400 shown in FIG. 4 includes a SPAD imaging array 405, high speed readout circuitry 410, function logic 415, and control circuitry 420.

As shown in the depicted example, imaging array 405 is a two-dimensional ("2D") array of backside illuminated imaging sensors or pixels (e.g., pixels P1, P2 . . . , Pn). In one example, each pixel includes a fully depleted SPAD in accordance with the teachings of the present invention. As illustrated in the depicted example, each pixel is arranged into a row (e.g., rows R1 to Ry) and a column (e.g., column C1 to Cx) to acquire image data of a person, place, or object, which can then be used to render a 2D image of the person, place, or object.

Output pulses generated by the SPAD regions of imaging array 405 are read out by high speed readout circuitry 410 and transferred to function logic 415. Readout circuitry 410 includes at least one digital counter for each of the SPAD regions and can also include amplification circuitry and/or quenching circuitry. Function logic 415 can simply store image data in memory or even manipulate the image data by applying post image effects (e.g., crop, rotate, remove red eye, adjust brightness, adjust contrast, or otherwise). Control circuitry 420 is coupled to imaging array 405 and/or to readout circuitry 410 to control operational characteristics of imaging array 405. For example, control circuitry 420 may simultaneously enable each of the digital counters included in high speed readout circuitry 410 for a window of time so as to implement a global shutter operation. Accordingly, embodiments of the SPAD stacked chip image sensor, discussed herein, provide for imaging that is both high speed and low light sensitive, which is typically not achieved with conventional sensor architectures.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An imaging sensor system, comprising:
a first semiconductor layer of a first wafer;
a single photon avalanche diode (SPAD) imaging array including a plurality of pixels formed in the first semiconductor layer, wherein the plurality of pixels include an N number of pixels, wherein substantially an entire thickness of the first semiconductor layer of each pixel is fully depleted such that a multiplication region included in each pixel near a front side of the first semiconductor layer is configured to be illuminated with photons through a back side of the first semiconductor layer and through the substantially entire thickness of the fully depleted first semiconductor layer;
deep n type isolation regions disposed in the first semiconductor layer between the pixels to isolate each one of the plurality of pixels from one another;
a second semiconductor layer of a second wafer bonded to the first wafer;
a plurality of digital counters formed in the second semiconductor layer and electrically coupled to the SPAD imaging array, wherein the plurality of digital counters includes at least N number of digital counters, wherein each of the N number of digital counters are coupled to count output pulses generated by a respective one of the plurality of pixels.

2. The imaging sensor system of claim 1 wherein each of the plurality of digital counters formed in the second semiconductor layer comprises a separate complementary metal oxide semiconductor (CMOS) circuit disposed in the second semiconductor layer of the second wafer.

3. The imaging sensor system of claim 1 further comprising a p+ doped region disposed on the back side of the first semiconductor layer.

4. The imaging sensor system of claim 1 wherein each of the N number of digital counters is coupled the respective one of the plurality of pixels through separate connections to respective terminals of the respective SPAD regions of the pixels.

5. The imaging sensor system of claim 1 further comprising:
a first interconnect layer disposed on the front side of the first semiconductor layer; and
a second interconnect layer disposed on the second semiconductor layer, wherein the first wafer is bonded to the second wafer at a bonding interface between the first interconnect layer and the second interconnect layer.

6. The imaging sensor system of claim 5, wherein the first interconnect layer includes a first oxide, the second interconnect layer includes a second oxide, and wherein the bonding interface includes an interface between the first oxide and the second oxide.

7. The imaging sensor system of claim 5, wherein the first interconnect layer comprises at least N number of vias, wherein each of the N number of vias are coupled to a respective pixel of the SPAD imaging array to transfer the output pulses to the second interconnect layer at the bonding interface.

8. The imaging sensor system of claim 7, wherein the vias comprise micro through silicon vias (μTSV).

9. The imaging sensor system of claim 1, wherein each pixel comprises a quenching element coupled to a respective SPAD region to quench avalanching of the respective SPAD region by lowering a bias voltage.

10. An integrated circuit system, comprising:
a first wafer having a plurality of first dies, each first die including:
a single photon avalanche diode (SPAD) imaging array including a plurality of pixels formed in a first semiconductor layer, wherein the plurality of pixels include an N number of pixels, wherein substantially an entire thickness of the first semiconductor layer of each pixel is fully depleted such that a multiplication region included in each pixel near a front side of the first semiconductor layer is configured to be illuminated with photons through a back side of the first semiconductor layer and through the substantially entire thickness of the fully depleted first semiconductor layer;
deep n type isolation regions disposed in the first semiconductor layer between the pixels to isolate each one of the plurality of pixels from one another;
a first interconnect layer disposed on the front side of the first semiconductor layer; and a second wafer having a plurality of second dies, each second die including:
  a second interconnect layer disposed on the second semiconductor layer, wherein the first wafer is bonded to the second wafer at a bonding interface between the first interconnect layer and the second interconnect layer;
  a plurality of digital counters formed in the second semiconductor layer and electrically coupled to the SPAD imaging array by way of the first and second interconnect layers, wherein the plurality of digital counters includes at least N number of digital counters, wherein each of the N number of digital counters are coupled to count output pulses generated by a respective SPAD region; and
  control circuitry coupled to the SPAD imaging array to control operation of the SPAD imaging array.

11. The integrated circuit system of claim 10 wherein each second die further includes function logic coupled to the plurality of digital counters to store data read out from the SPAD imaging array.

12. The integrated circuit system of claim 10 wherein each of the plurality of digital counters formed in the second semiconductor layer comprises a separate complementary metal oxide semiconductor (CMOS) circuit disposed in the second semiconductor layer of the second wafer.

13. The integrated circuit system of claim 10 wherein each first die further includes a p+ doped region disposed on the back side of the first semiconductor layer.

14. The integrated circuit system of claim 10 wherein each of the N number of digital counters is coupled the respective one of the plurality of pixels through separate connections to respective terminals of the respective SPAD regions of the pixels.

15. The integrated circuit system of claim 10, wherein the first interconnect layer includes a first oxide, the second interconnect layer includes a second oxide, and wherein the bonding interface includes an interface between the first oxide and the second oxide.

16. The integrated circuit system of claim 10, wherein the first interconnect layer comprises at least N number of vias, wherein each of the N number of vias are coupled to a respective pixel of the SPAD imaging array to transfer the output pulses to the second interconnect layer at the bonding interface.

17. The integrated circuit system of claim 16 wherein the vias comprise micro through silicon vias (µTSV).

18. The integrated circuit system of claim 10, wherein each pixel comprises a quenching element coupled to a respective SPAD region to quench avalanching of the respective SPAD region by lowering a bias voltage.

* * * * *